United States Patent [19]

Wells, Jr. et al.

[11] 4,280,092

[45] Jul. 21, 1981

[54] GROUND FAULT INTERRUPTER TESTER

[75] Inventors: Peter M. Wells, Jr., Sycamore, Ill.; Roger E. Mitchell, Minneapolis, Minn.

[73] Assignee: Ideal Industries, Inc., Sycamore, Ill.

[21] Appl. No.: 32,349

[22] Filed: Apr. 23, 1979

[51] Int. Cl.³ ............................................ G01R 31/02
[52] U.S. Cl. ...................................... 324/51; 324/133
[58] Field of Search ............................ 324/51, 52, 133

[56] References Cited

U.S. PATENT DOCUMENTS

| 3,821,639 | 6/1974 | Langis | 324/51 |
| 3,898,557 | 8/1975 | Strock | 324/51 |
| 4,002,968 | 1/1977 | Reid | 324/51 |
| 4,006,409 | 2/1977 | Adams | 324/51 |
| 4,127,807 | 11/1978 | Peplow et al. | 324/51 |
| 4,166,242 | 8/1979 | Spiteri | 324/51 |

Primary Examiner—Michael J. Tokar
Attorney, Agent, or Firm—Kinzer, Plyer, Dorn & McEachran

[57] ABSTRACT

A hand-held ground fault interrupter for checking the operation of a ground fault protected wall receptacle. The blades of an electrical terminal protrude from one end of a housing which contains a potentiometer and electrical connecting means between the potentiometer and the blades. The tester creates a ground fault by allowing current to leak to the ground path, the amount of leakage varied by the potentiometer. A properly operating ground fault interrupter senses the leakage and is designed to trip when it sees a selected level of current leakage. Tripping at lower levels or failure to trip at higher levels indicates a defective interrupter. Recesses in the sides of the housing provide access to the potentiometer dial for rotating the dial and reading a label affixed thereto.

8 Claims, 5 Drawing Figures

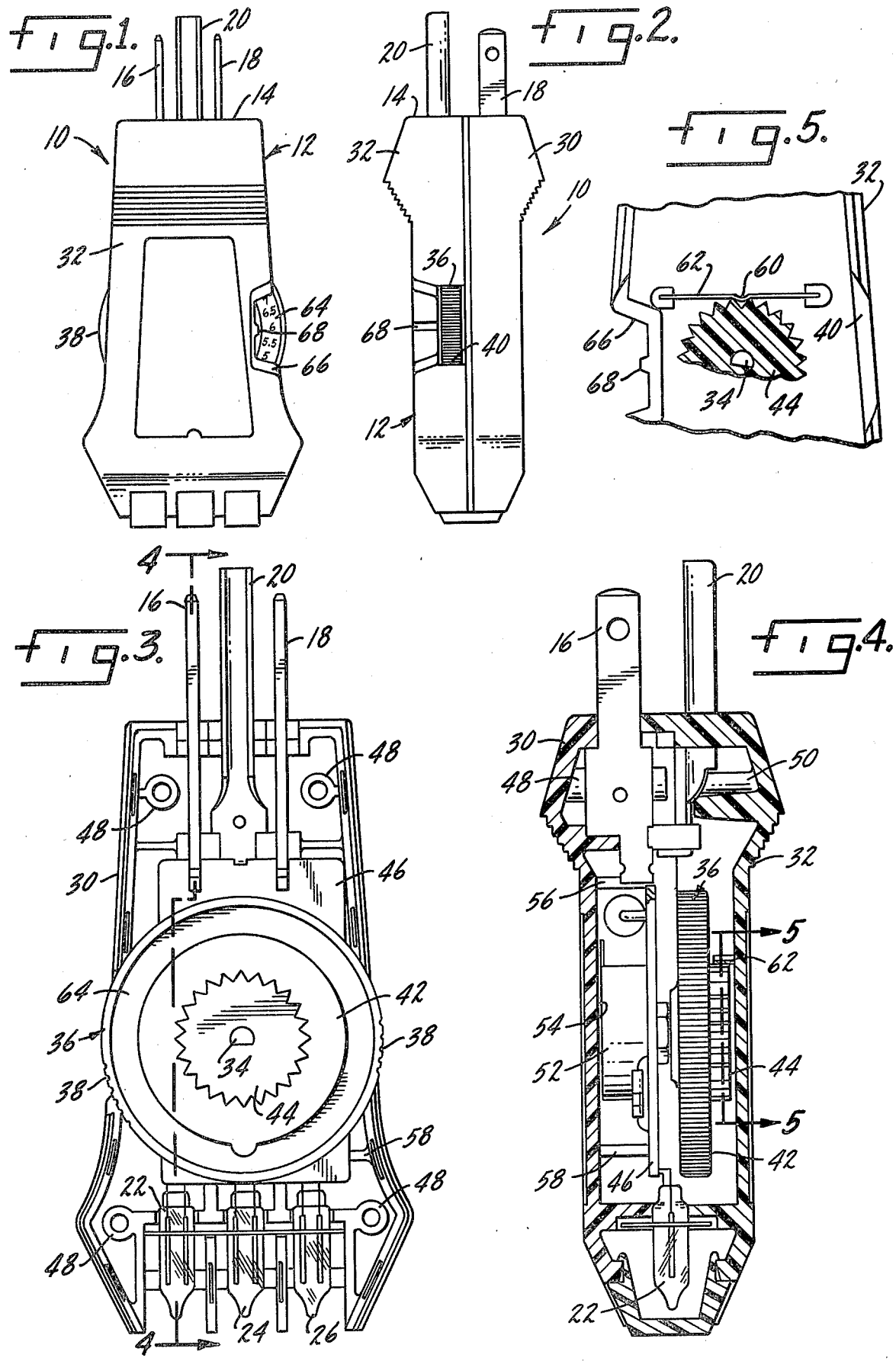

GROUND FAULT INTERRUPTER TESTER

BACKGROUND OF THE INVENTION

This invention relates in general to electrical testing equipment and more particularly to a hand-held tester for checking the operativeness of a ground fault interrupter in an electrical outlet.

The National Electrical Code now requires ground fault interrupter protection for newly-installed residential outdoor, kitchen and bathroom outlets, in addition to outlets near swimming pools on construction sites and elsewhere. Assuring proper operation of newly-installed interrupter is necessary to avoid building code violations and costly repairs at a later time. Similarly, proper interrupter operation on construction sites is important to job progress and woker safety. Insensitive devices fail to protect users while hypersensitive ones break circuits due to non-dangerous conditions such as line transients and motor starts. The latter problem is called nuisance tripping. Dirty outlets tend to become hypersensitive making nuisance tripping a common problem.

In the past, testing of a ground fault interrupters has been accomplished with go or no-go type devices. These devices would create a single test condition to which the interrupter might or might not react. In either case, the person doing the testing lacks full information because he does not know the condition impressed on the interrupter during the test. If the interrupter did not trip, it could be that the device properly failed to respond to a low-level ground fault. It could also be that the trip mechanism is not functioning. On the other hand, if the interrupter does trip after application of a go/no-go tester, there is still no assurance that the interrupter is not subject to nuisance tripping.

SUMMARY OF THE INVENTION

A primary object of the present invention is the testing of ground fault interrupter protected electrical receptacles by impressing on the interrupter a range of ground fault current levels to check for proper operation over that entire range.

A related object is the testing of ground fault interrupters in a fast and convenient manner which permits blanket testing of a large number of receptacles, rather than just spot checking.

Another object is ground fault interrupter testing which can be incorporated into existing designs for hand-held receptacle wiring testers.

A hand-held ground fault interrupter tester is provided which includes a generally flat, elongated housing. A set of electrical terminal blades protrudes from one end of the housing for insertion into an electrical receptacle. The housing contains a potentiometer which can be controlled by the user. Electrical connecting means are provided between the potentiometer and terminal blades. Upon insertion into a receptacle, the tester allows current to leak to the ground path, creating a temporary ground fault. Starting at the low end of its range, the potentiometer is adjusted to gradually increase the leakage level. A properly functioning interrupter will trip at the middle of the potentiometer range. Tripping below this level indicates a hypersensitive interrupter. Failure to trip at the desired or higher level discloses an inoperative interrupter.

BRIEF DESCRIPTION OF THE DRAWINGS

FIG. 1 is a top plan view of a ground fault interrupter tester constructed in accordance with the present invention;

FIG. 2 is a side view of FIG. 1;

FIG. 3 is an enlarged top view of a ground fault interrupter tester with the cover portion of the housing removed;

FIG. 4 is a section taken approximately along line 4—4 of FIG. 3; and

FIG. 5 is a top sectional view of the dial gear and spring taken approximately along line 5—5 of FIG. 4.

DESCRIPTION OF THE PREFERRED EMBODIMENT

A hand-held ground fault interrupter tester 10 for checking the operativeness of a wall receptacle ground fault interrupter is shown in FIGS. 1-5. The tester includes a housing 12 having a set of electrical terminal blades protruding from one end 14. The terminal blades include two parallel, flat blades 16 and 18 and a generally U-shaped ground blade 20. The blades are mounted in a conventional fixed positional relationship for insertion into a wall receptacle. The housing of this embodiment also contains three indicator lamps 22, 24 and 26 and electrical connecting means between each lamp and a respective pair of the terminal blades so that the lighting of each lamp and each combination of lamps indicates a predetermined wiring condition of a wall receptacle into which the terminal blades may be inserted. The mounting and operation of the terminal blades and indicator lamps are described in detail in the U.S. patent application of Marvin J. Peplow et al, Ser. No. 759,449, filed Jan. 14, 1977.

The housing 12 is longitudinally split, as best shown in FIG. 2, and thereby consists of a casing portion 30 and cover portion 32. The cover portion is omitted from the view in FIG. 3 to reveal the internal construction and components of the tester. Located on the longitudinal midline of the housing is the potentiometer shaft 34. Attached to the shaft is the potentiometer dial 36. The dial in this embodiment has a diameter sufficiently larger than the housing width so that the circumference 38 of the dial protrudes through slots 40 in the sides of the housing cover portion 32. Integrally formed in the top face 42 of the dial is a gear 44. Located just below the dial is the circuit board assembly 46. This assembly provides electrical connection between the terminal blades 16, 18 and 20 and the indicator lamps 22, 24 and 26. Also shown in FIG. 3 are four sleeves 48 which are used in peg and sleeve type connections between the cover portion 32 and casing portion 30 of the housing 12. One of the pegs 50 can be seen in FIG. 4. The pegs are adapted to be received within their cooperating sleeves to fix the lateral and longitudinal positional relationship between the cover and casing in the assembled tester.

Looking further at FIG. 4, the rotary potentiometer 52 may be mounted on the bottom wall 54 of the casing 30. Walls 56 and 58 support the circuit board assembly 46. The circuit board assembly contains electrical connecting means between the terminal blades 16, 18 and 20 and potentiometer 52. Potentiometer output is controlled by the rotational position of the dial 36. Uniform, discrete, stepping rotation is achieved through use of the gear 44. The gear rotates with the dial 36. The teeth of the gear engage a notch 60 in a spring 62 (FIG.

5). The spring is mounted on the cover portion 32 of the housing. The notch 60 tends to rest between gear teeth, preventing the dial from rotating under incidental forces such as might arise from mere brushing contact with the dial. When the dial is intentionally rotated by the user, the spring flexes away from the gear, allowing a tooth to pass by the notch. When the tooth clears, the notch snaps back into the next gap between teeth. This arrangement allows for positive, repeatable potentiometer settings which in turn makes simpler the calibration and use of the tester.

The dial 36 has a circular label 64 affixed on its top face 42 near the circumference 38. The top face 42 may have a circular portion slightly recessed into the dial to protect the edges of the label. A laminated label with a pressure-sensitive adhesive backing may then be applied to the dial, the label generally filling the recess of the top face 42 and lying flush with that face. This embodiment includes a label on both faces of the dial. To make the labels visible, that portion of the housing above the circumference 38 of the dial 36 is cut away, creating a recess 66. The recess has an upset portion 68 in the middle which serves as an indicator for the label. Since there are labels on both sides of the dial, one recess 66 is in the casing portion 30 and another is provided in the cover portion 32. Placing these recesses on opposite sides of the housing affords maximum protection for the protruding portions of the dial 36. The use of twin labels and accompanying recesses means a label will be visible regardless of the orientation required for insertion of the tester.

The operation, use and function of the present invention are as follows:

Upon plugging the tester into a receptacle protected by a ground fault interrupter, the electrical connecting means permit a current leakage ot the ground path of the receptacle. This creates a temporary ground fault. The level of current leakage can be variably controlled by the rotary potentiometer. The potentiometer is designed to permit selection of a range of leakage currents. This range lies on either side of the level at which a properly-functioning ground fault interrupter should trip. To use the tester, the potentiometer dial is positioned at the setting for its lowest leakage current. Then the tester is inserted into the receptacle in the same manner as the plug of any electrical appliance. Immediately upon plugging the tester in, a lamp or combination of lamps will light up. If no lamp lights up, either the receptacle is improperly wired or it is receiving no power. Next, the dial is turned toward the higher end of its range. A properly-functioning ground fault interrupter will trip at the middle of the potentiometer range. In an ordinary household system (120 volts), the interrupter should break the circuit when there is a leakage current of 5 ma (milliamps). Tripping will cause the indicator lamps to go out. If this occurs at the low end of the potentiometer range, it indicates the ground fault interrupter is defective because it is overly sensitive. This condition results in nuisance tripping. If the interrupter trips only at the higher levels of leakage, or does not trip at all, the interrupter is defective because it is not sensitive enough.

Checking ground fault interrupters with the tester device of the present invention has several important advantages. First, the user knows and controls the ground fault condition he is inducing by use of the tester. This permits detection of hypersensitive interrupters, as well as insensitive ones. Checking can be accomplished quickly since the receptacle plate need not be removed nor the receptacle itself pulled away from the wall for visual inspection. Also, the interrupter testing feature can readily be combined with the wiring tester disclosed in the above-mentioned U.S. patent application of Peplow, Ser. No. 759,449.

Whereas the preferred form of the invention has been described herein, it should be realized that there may be many modifications, substitutions and alterations thereto.

I claim:

1. A hand-held ground fault interrupter tester comprising:
    a housing,
    a potentiometer contained within the housing,
    electrical terminal blades mounted in the housing and protruding from one end in fixed positional relationship for insertion into a wall receptacle,
    electrical connecting means between the potentiometer and terminal blades, said means permitting a potentiometer-controlled current leakage to the ground path which, upon reaching a desired level, will trip a properly functioning ground fault interrupter so that tripping at a lower level or failure to trip at higher levels will indicate a defective interrupter.

2. The structure of claim 1 wherein the potentiometer is of the rotary type, having a disc-shaped potentiometer dial whose rotational position variably determines the output of the potentiometer.

3. The structure of claim 2 wherein at least one of the edges of the potentionmeter dial protrudes through a slot in a surface of the housing, providing access for rotating the dial.

4. The structure of claim 3 wherein the potentiometer dial has a circular label attached to a face of the dial for indicating the level of current leakage at a particular dial setting.

5. The structure of claim 4 wherein the outside diameter of the label is substantially tangential to the side of the housing and the housing has a recess cut into it above the label so as to expose the label to view.

6. A hand-held ground fault interrupter tester according to claim 2 wherein the housing has a generally flat, elongated configuration and the potentiometer dial is mounted on a shaft located on the longitudinal midline of the tester, the dial having a diameter sufficiently larger than the housing width such that the dial edges extend through both sides of the housing.

7. The structure of claim 6 wherein the potentiometer dial has a circular label attached to both faces of the dial for indicating the level of current leakage at a particular dial setting, the labels having an outside diameter substantially equal to the housing width and the housing having recesses cut into it above each label so as to expose them to view.

8. A hand-held ground fault interrupter tester according to claim 1 which includes at least one indicator lamp which lights upon insertion of the tester into a live receptacle and goes out upon tripping of the ground fault interrupter.

* * * * *